United States Patent [19]

Hasuo et al.

[11] 4,423,430

[45] Dec. 27, 1983

[54] SUPERCONDUCTIVE LOGIC DEVICE

[75] Inventors: Shinya Hasuo; Hideo Suzuki, both of Yokohama, Japan

[73] Assignee: Fujitsu Limited, Kawasaki, Japan

[21] Appl. No.: 236,579

[22] Filed: Feb. 20, 1981

[30] Foreign Application Priority Data

| Feb. 20, 1980 | [JP] | Japan | 55-20214 |
| Jul. 4, 1980 | [JP] | Japan | 55-91371 |
| Jul. 4, 1980 | [JP] | Japan | 91372 |
| Jul. 11, 1980 | [JP] | Japan | 55-94593 |
| Jul. 15, 1980 | [JP] | Japan | 55-96390 |

[51] Int. Cl.³ .............. H01L 39/22; H01L 27/12; H03K 3/38
[52] U.S. Cl. .............. 357/5; 357/4; 307/306
[58] Field of Search .............. 307/306; 357/4, 5

[56] References Cited

U.S. PATENT DOCUMENTS

| 3,689,780 | 9/1972 | Meissner et al. | 307/306 |
| 3,803,459 | 4/1974 | Matisoo | 307/306 X |
| 4,117,354 | 9/1978 | Gheewala | 307/306 |
| 4,313,066 | 1/1982 | Gheewala | 307/306 X |

OTHER PUBLICATIONS

T. A. Fulton, J. H. Magnerlein, L. N. Dunkleberger; *IEEE Trans. Magn.*, vol. MAG-13, No. 1, Jan. 1977, pp. 56-58.

T. R. Gheewala; *IEEE J. Solid State Circ.* vol. SC-14, No. 5, Oct. 1979, pp. 787-793.

C. J. Kircher, M. Murakami; *Science* vol. 208, May 1980, pp. 944-950.

J. Matisoo; *Proc. IEEE*, vol. 55, No. 2, Feb. 1967, pp. 172-180.

H. H. Zappe, K. R. Grebe; *J. Appl. Phys.*, vol. 44, No. 2, Feb. 1973, pp. 865-874.

*Primary Examiner*—Martin H. Edlow
*Assistant Examiner*—J. L. Badgett
*Attorney, Agent, or Firm*—Staas & Halsey

[57] ABSTRACT

A superconductive logic device incorporating at least one Josephson junction comprises two superconductive electrodes, that is, a base electrode and a counter electrode with a thin insulating layer therebetween. The counter electrode has an extension for receiving an input signal and another extension connected to a ground plane. The input signal current which is supplied from the counter electrode to the ground plane acts on the Josephson junction with a magnetic field, while, a bias current is supplied from the base electrode and flows through the Josephson junction to the ground plane.

16 Claims, 32 Drawing Figures

Fig. 8 (1)
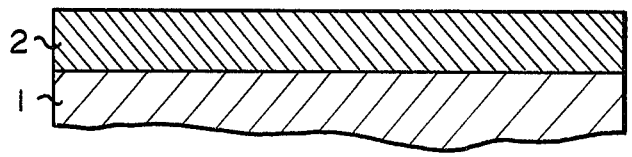
Fig. 8 (2)
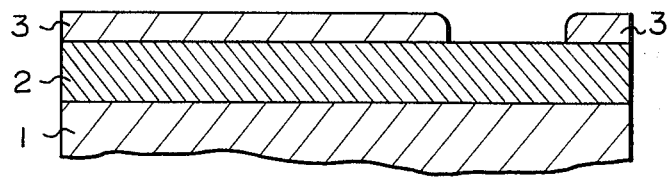
Fig. 8 (3)
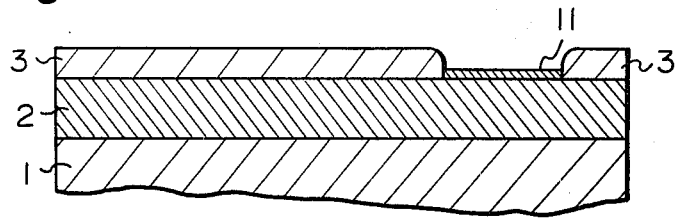
Fig. 8 (4)
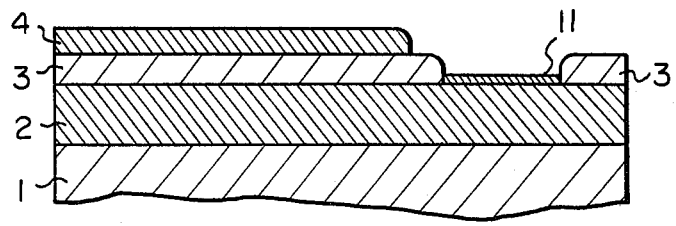

Fig. 8 (5)
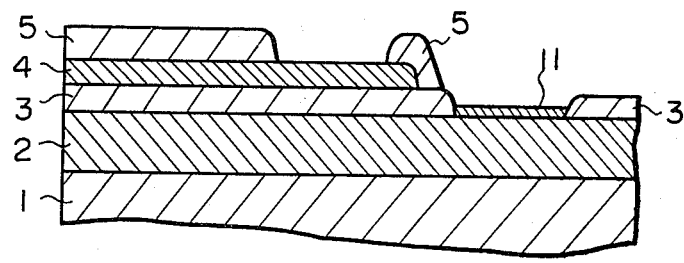
Fig. 8 (6)
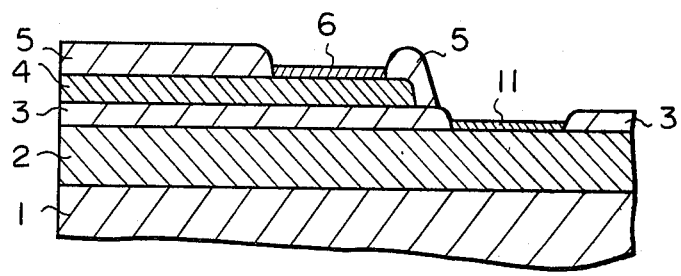
Fig. 8 (7)
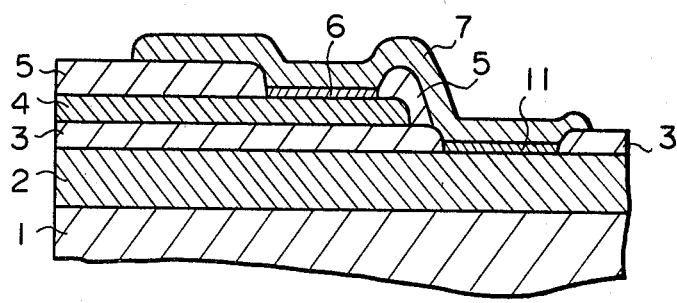

SUPERCONDUCTIVE LOGIC DEVICE

BACKGROUND OF THE INVENTION
1. Field of the Invention

The present invention relates to a superconductive logic device and, more particularly, to a superconductive logic device incorporating Josephson junctions which, for example, can be used for digital computers.

2. Description of the Prior Art

As is well known, a Josephson junction comprises two superconductive layers with a thin insulating layer therebetween, which is so thin that superconductive electrons can pass therethrough. The Josephson junction serves as a switching device, wherein the critical current of the junction is controlled by acting on the junction with a magnetic field.

A first conventional superconductive logic device incorporating Josephson junctions comprises a superconductive ground plane, a superconductive base electrode, a superconductive counter electrode which is opposite to the base electrode, and a superconductive control line. The above-mentioned superconductive elements are electrically insulated from each other. The base and counter electrodes form a Josephson junction in association with a thin insulating layer therebetween. In this case, the control line extends over the junction. The first conventional device is called a magnetic field coupled type gate and is disclosed in J. Matisoo, "The Tunneling Cryotron—A Superconductive Logic Element Based on Electron Tunneling," Proc. IEEE Vol. 55 No. 2 February (1967) pp. 172–180 (in particular, FIG. 3).

The junction has a voltage state and a zero-voltage state. The two states are switched by changing the magnetic field induced by the input signal current flowing through the control line, or by changing the bias current which is supplied from the base electrode and flows through the junction to the counter electrode. Thus, the first conventional superconductive logic device incorporating Josephson junctions can serve as a switching device.

However, in the above-mentioned first conventional device, a large number of layers is required and therefore, a large number of manufacturing steps is required so that the manufacturing cost of the device is high. In addition, since most of the patterns are made by the etching or the lift-off of thin films which are deposited by evaporation or sputtering, a large number of disconnections and short circuits is often created in the stepped portions so that the manufacturing yield of the device is low.

A second conventional superconductive logic device incorporating Josephson junctions comprises a superconductive ground plane, a superconductive base electrode and a superconductive counter electrode, which are also electrically insulated. In this case, the base electrode serves also as a control line. Therefore, the number of layers are reduced and accordingly, the amount of the manufacturing cost is reduced, as compared with the first conventional device. In addition, the number of disconnections and short circuits created in the stepped portions is reduced as compared with the first conventional device. The second conventional device is called a current injection logic type (CIL) and is disclosed in T. R. Gheewala "A 30-ps Josephson Current Injection Logic (CIL)," IEEE J. Solid-State Circ. Vol. SC-14, No. 5, pp. 787–793, October 1979, and in T. A. Fulton, J. H. Magnerlein and L. N. Dunklebeberger, "A Josephson Logic Design Employing Current-Switched Junctions," IEEE Trans. Magn. Vol. MAG-13, No. 1 January (1977) pp. 56–58 (in particular, in FIG. 1).

However, in the second conventional device, since an input signal current is supplied to the base electrode, which also receives a bias current, the input signal current and the bias current are united with each other. Therefore, isolation between input and output components is difficult and accordingly, circuit designs using it are complex.

SUMMARY OF THE INVENTION

It is a principal object of the invention to provide a superconductive logic device incorporating Josephson junctions with a simple structure and with input and output components being easily isolated.

It is another object of the present invention to provide a superconductive logic device with a simple structure and which incorporates Josephson junctions for performing various logic operations.

According to the present invention, there is provided a superconductive logic device comprising: a superconductive ground plane; a first insulating layer formed on the superconductive ground plane; a superconductive base electrode, for receiving a bias current, formed on the first insulating layer; second and third insulating layers formed on the superconductive base electrode, the second insulating layer being thicker than the third insulating layer; a superconductive counter electrode formed on the second and third insulating layers; a first superconductive counter electrode extension being electrically connected to the superconductive ground plane; a second superconductive counter electrode extension serving as an input terminal for an input signal; and at least one Josephson junction comprising the superconductive base electrode and the counter electrode, the third insulating layer being formed therebetween.

According to the present invention, there is also provided a superconductive logic device comprising: a superconductive ground plane, a first insulating layer formed on the superconductive ground plane; a T-shaped superconductive base electrode having a leg portion for receiving a bias current; second and third insulating layers on the T-shaped superconductive base electrode, the third insulating layer being located at both sides of an arm portion of the T-shaped superconductive base electrode, the second insulating layer being thicker than the third insulating layer; a superconductive counter electrode formed on the second and third insulating layers, having two extensions for receiving two input signals extending over the arm portion of the T-shaped superconductive counter electrode, and having one extension located at an intermediate position thereof and connected to the superconductive ground plane; and at least two Josephson junctions comprising the T-shaped superconductive base electrode, the superconductive counter electrodes and the third insulating layer formed therebetween.

According to the present invention, there is still provided a superconductive logic device comprising: a superconductive ground plane; a first insulating layer formed on the superconductive ground plane; a forked superconductive base electrode having a leg portion for receiving a bias current; second and third insulating layers on the forked superconductive base electrode, the third insulating layer being located at both arm portions of the forked superconductive base electrode, the second insulating layer being thicker than the third insulating layer and; two L-shaped superconductive counter electrodes formed on the second and third insulating layers, each having a first extension for receiving an input signal and a second extension connected to the superconductive ground plane; and at least two Josephson junctions comprising the forked superconductive base electrode, the L-shaped superconductive counter electrode and the third insulating layer formed therebetween.

According to the present invention, there is further provided a superconductive logic device comprising: a plurality of series circuits, each comprising a resistor and a counter electrode direct-coupled Josephson junction connected in series; a connection point, for connecting the series circuit, producing an output signal; and a counter electrode direct-coupled Josephson junction comprising: a superconductive ground plane; a first insulating layer formed on the superconductive ground plane; a superconductive base electrode, for receiving a bias current, formed on the first insulating layer; second and third insulating layers formed on the superconductive base electrode, the second insulating layer being thicker than the third insulating layer; a superconductive counter electrode formed on the second and third insulating layers; a first superconductive counter electrode extension being electrically connected to the superconductive ground plane; and a second superconductive counter electrode extension serving as an input terminal for an input signal; and at least one Josephson junction comprising the superconductive base and counter electrode, and the third insulating layer formed therebetween.

According to the present invention, there is still further provided a superconductive logic device comprising: a first circuit comprising a first resistor and a counter electrode direct-coupled Josephson junction in series, at least one second circuit, each comprising a second resistor and another type Josephson junction in series, the second circuit being connected to the first circuit in parallel; a connection point, for connecting the first and second circuits, receiving a bias current and providing an output signal; and the counter electrode direct-coupled Josephson junction comprising: a superconductive ground plane; a first insulating layer formed on the superconductive ground plane; a superconductive base electrode, for receiving a bias current, formed on the first insulating layer; second and third insulating layers formed on the superconductive base electrode, the second insulating layer being thicker than the third insulating layer; and a superconductive counter electrode formed on the second and third insulating layers; a first superconductive counter electrode extension being electrically connected to the superconductive ground plane; a second superconductive counter electrode extension serving as an input terminal for an input signal; and at least one Josephson junction comprising the superconductive base and counter electrode, and the third insulating layer formed therebetween.

BRIEF DESCRIPTION OF THE DRAWING

The present invention is more clearly understood from the following description contrasted with the conventional devices and with reference to the accompanying drawings, wherein:

FIGS. 8(1) through 8(7) are cross-sectional views for explaining the manufacturing steps of the device of FIG. 5;

DESCRIPTION OF THE PREFERRED EMBODIMENTS

Figure 1A:
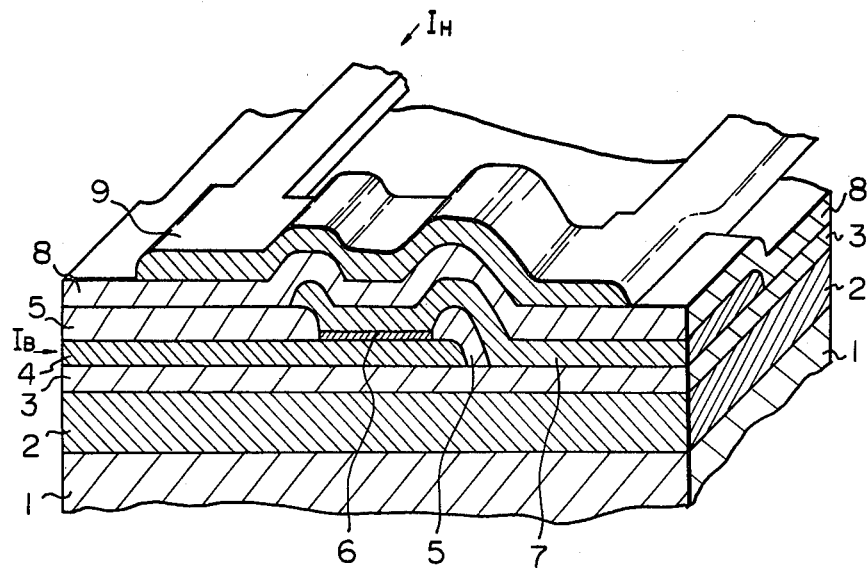
FIG. 1A is a perspective view, partly in section, illustrating a first conventional superconductive logic device.

In FIG. 1A which illustrates a first conventional superconductive logic device, a superconductive ground plane 2 is formed on an insulating substrate 1 which is, for example, silicon. On the ground plane 2 there is a relatively thick insulating layer 3 on which two superconductive layers, that is, a base electrode 4 and a counter electrode 7 are formed. The electrodes 4 and 7 are electrically insulated by a relatively thick insulating layer 5 and a relatively thin insulating layer 6. In this case, the thin insulating layer 6 is so thin that superconductive electrons can pass therethrough. Therefore, the electrodes 4 and 7 in association with the thin insulating layer 6 form a Josephson junction. In addition, on the insulating layer 5 and the counter electrode 7, there is formed another relatively thick insulating layer 8 on which a superconductive control line 9 is formed. The superconductive elements 2, 4, 7 and 9 are made of, for example, niobium or lead, while the insulating layers 3, 5, 6 and 8 are made of, for example, SiO.

Figure 1B:
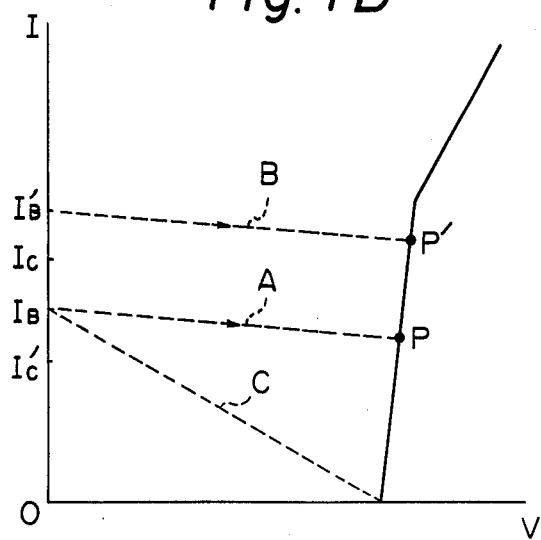
FIG. 1B is a voltage (V) to current (I) characteristic diagram of the Josephson junction of FIG. 1A.

The Josephson junction comprising the electrodes 4 and 7 and the insulating layer 6 has voltage (V) to current (I) characteristics as illustrated in FIG. 1B. The essential operation of the Josephson junction is as follows: Even when the difference in potential between the electrodes 4 and 7 is zero, a current flows through the junction. In this case, the current, which is called a superconductive current $I_S$, is represented by $I_S = I_C \sin(\theta_2 - \theta_1)$, where $I_C$ is a critical current, and $\theta_1$ and $\theta_2$ are phases of the wave-functions of the electrodes 4 and 7, respectively. When a bias current $I_B$, whose value is larger than the critical current $I_C$, is supplied from an external current source (not shown) to the Josephson junction, a normal conductive current in addition to the superconductive current $I_S$ flows through the junction so that a difference in potential is generated between the electrodes 4 and 7. The critical current $I_C$ is increased or decreased in accordance with a magnetic field generated in the junction, which field is, in this case, induced by an input signal current $I_H$ flowing through the control line 9.

For example, when $I_H = 0$ and $I_B < I_C$, then the difference in potential between the electrodes 4 and 7 is zero, as is apparent from FIG. 1B. This state corresponds to the zero-voltage state of the Josephson junction. Contrary to this, when the input signal current $I_H$ is increased so as to act upon the junction with a magnetic field, the critical current is changed from $I_C$ to $I_C'$. As a result, $I_B > I_C'$; then, the operating point is moved along a dotted line A to a point P. Therefore, a difference in potential between the electrodes 4 and 7 is generated. This state corresponds to the voltage state of the Josephson junction. Similarly, when the bias current is changed from $I_B$ to $I_B'$ while retaining the critical current $I_C$ ($I_H = 0$), the operating point is moved along a dotted line B to a point P'. Therefore, a difference in potential between the electrodes 4 and 7 is also generated. In other words, the Josephson junction is placed in the voltage state. Thus, the voltage and zero-voltage states are switched by changing the input signal current $I_H$ or by changing the bias current $I_B$.

Figure 1C:
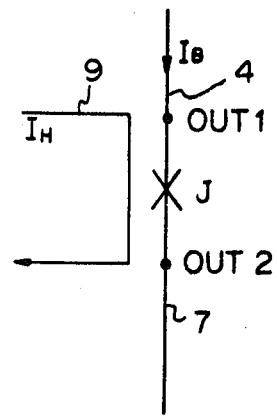
FIG. 1C is an equivalent circuit diagram of the superconductive logic device of FIG. 1A.

FIG. 1C is an equivalent circuit diagram of the superconductive logic device of FIG. 1A. In FIG. 1C, J indicates the Josephson junction comprising the base electrode 4, the insulating layer 6 and the counter electrode 7 in FIG. 1A. As is apparent from FIG. 1C, the circuit of the Josephson junction J is independent of and separated from the circuit for the input signal current $I_H$. Therefore, isolation between the input and output signals is easy. In this case, the output signals are obtained at the terminals OUT1 and OUT2, that is, the electrodes 4 and 7.

However, in the first conventional device of FIG. 1A, the device is of a multi-layer structure wherein a large number of layers is provided. Therefore, the number of manufacturing steps is large and a high cost is required. In addition, a difficulty arises, from the manufacturing point of view, in that, for example, disconnections and short circuits are often created.

Figure 2A:
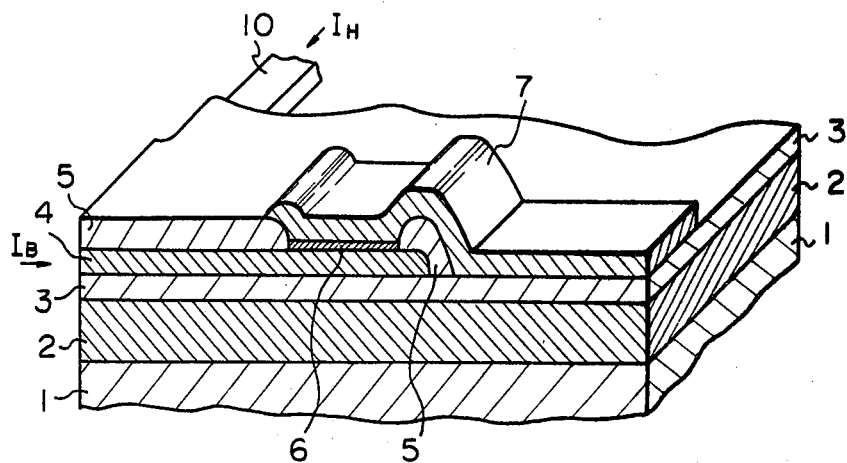
FIG. 2A is a perspective view partly in section illustrating a second conventional superconductive logic device.

FIG. 2A is a perspective view, partly in section, illustrating a second conventional superconductive logic device incorporating a Josephson junction. In FIG. 2A, the elements, which are the same as those of FIG. 1A, are denoted by the same reference numerals. In FIG. 2A, control line 10 is combined with the base electrode 4. In other words, the control line 10 and the base electrode 4 are manufactured simultaneously during the same manufacturing step. Therefore, since two layers, that is, the insulating layer 8 and the control line 9 in FIG. 1, are omitted, the number of manufacturing steps is reduced and the number of disconnections or short circuits occurring during the manufacturing processes can be reduced as compared with the first conventional device of FIG. 1A.

Figure 2B:
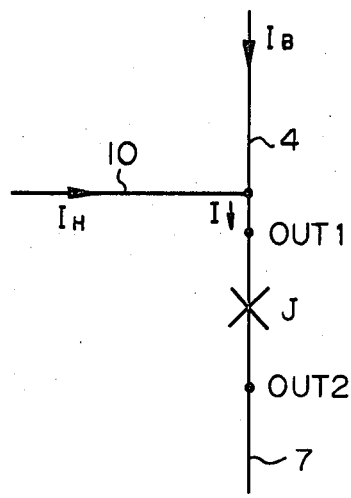
FIG. 2B is an equivalent circuit diagram of the superconductive logic device of FIG. 2A.

FIG. 2B is an equivalent circuit diagram of the superconductive logic device of FIG. 2A. The switching of the voltage and zero-voltage states is dependent upon $I > I_C$ or $I < I_C$, where I is the current element flowing through the Josephson junction J and $I_C$ is the critical current of the junction J. The former corresponds to the voltage state, while the latter corresponds to the zero-voltage state. In this case, as is apparent from FIG. 2B, the current element I is represented by $I_H + I_B$. Therefore, such switching may be effected by changing the current element I, instead of changing the magnetic field generated in the junction J, that is, the critical current $I_C$.

However, in this second conventional device of FIG. 2A, the input signal current $I_H$ and the bias current $I_B$ are united with each other at the base electrode 4, so that isolation between input and output components is difficult and thus, circuit designs using it are complex.

Figure 3:
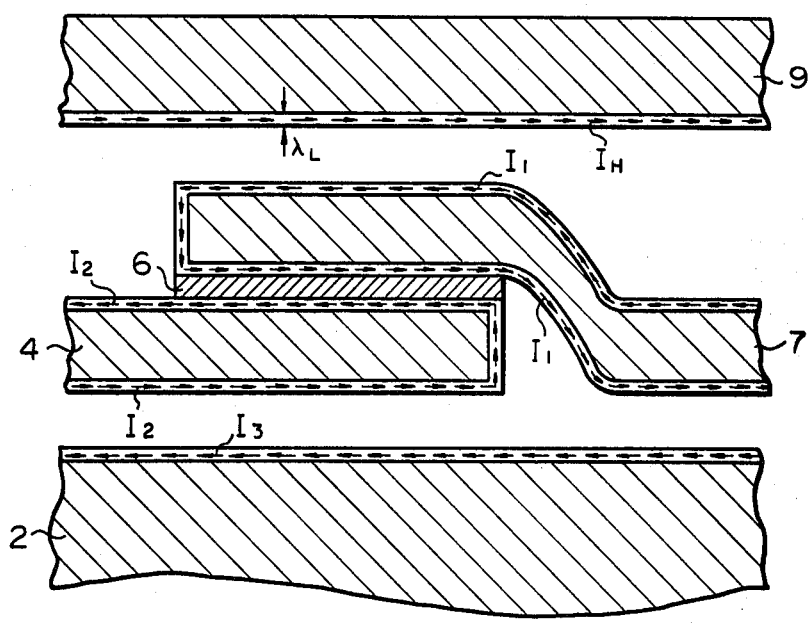
FIG. 3 is an enlarged cross-sectional view of the Josephson junction portion of FIG. 1A.

Next, the magnetic field induced by the input signal current $I_H$ is explained. Again, in the first conventional superconductive device of FIG. 1A, the input signal current $I_H$ flowing through the control line 9 acts upon the Josephson junction with a magnetic field, so that the critical current $I_C$ of the junction is changed. In more detail, referring to FIG. 3, which is an enlarged cross-sectional view of the Josephson junction portion of FIG. 1A, when the input signal current $I_H$ flows through the control line 9, the current $I_H$ flows on the surface of the control line 9, so that no magnetic field is generated in the superconductive control line 9. In this case, the thickness $\lambda_L$ of the current flowing surface region is called London's penetration depth. In addition, the current $I_H$ causes a current $I_1$ to flow on the surface of the counter electrode 7, so that no magnetic field is generated in the superconductive counter electrode 7. In this case, the current $I_1$ is called an image current. Similarly, currents $I_2$ and $I_3$ which are also image currents flow on the surfaces of the base electrode 4 and the ground plane 2, respectively, so that no magnetic fields are generated in the superconductive base electrode 4 and the superconductive ground plane 2. The magnitudes of the image currents $I_1$, $I_2$ and $I_3$ are almost the same as the input signal current $I_H$. For example, if there is no space between the ground plane 2, the electrodes 4 and 7, and the control line 9, each of the image currents $I_1$, $I_2$ and $I_3$ is equal to the input signal current $I_H$. However, actually, there are insulating layers 3, 5 and 8 (not shown in FIG. 3, but shown in FIG. 1A) therebetween, made of, for example, SiO, of several thousand Å thickness. Therefore, each of the image currents $I_1$, $I_2$ and $I_3$ is a little smaller than the input signal current $I_H$.

Since the input signal current $I_H$ is almost equal to the image current $I_1$ flowing on the upper surface of the counter electrode 7, which currents are flowing in opposite directions to each other, the two magnetic fields induced by the two currents $I_H$ and $I_1$ oppose each other. Similarly, the image current $I_2$ flowing on the lower surface of the base electrode 4 is almost equal to the image current $I_3$ flowing on the upper surface of the ground plane 2, which currents are flowing in opposite directions to each other, and the two magnetic fields induced by the two currents $I_2$ and $I_3$ also oppose each other. After all, the magnetic field in the Josephson junction which corresponds to the insulating layer 6 is determined by only two currents, that is, the image current $I_1$ flowing on the lower surface of the counter electrode 7 and the image current $I_2$ on the upper surface of the base electrode 4. In other words, if the current $I_1$ can flow through the lower surface of the counter electrode 7, the ground plane 2 and the control line 9 are unnecessary. However, it should be noted that the ground plane 2 is indispensable for generating a magnetic field effectively in the Josephson junction.

Therefore, the present invention is based on the idea that, if the current $I_1$ can flow on the lower surface of the counter electrode 7, the control line 9 can be omitted. According to the present invention, there is provided a counter electrode direct-coupled type logic device (CCL) in which a counter electrode serves also as a control line and is connected electrically and directly to a ground plane.

Figure 4A:
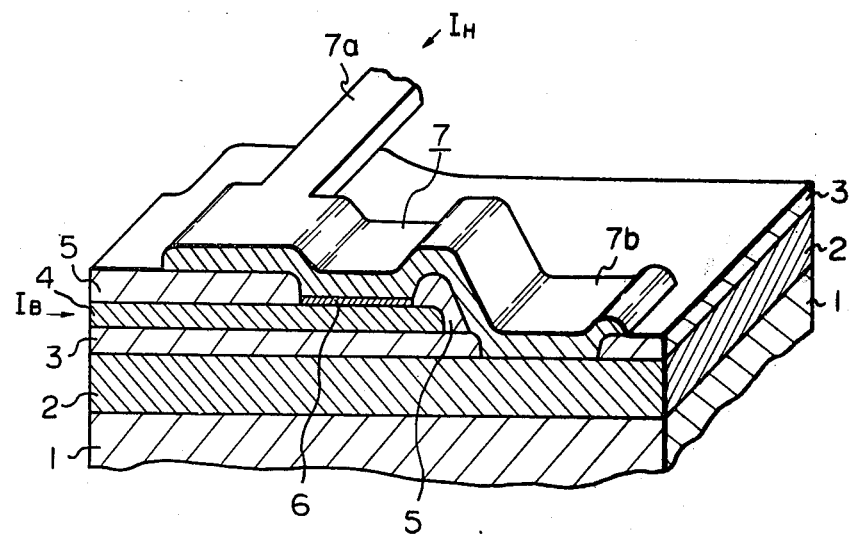
FIG. 4A is a perspective view partly in section illustrating a first embodiment of the superconductive logic device according to the present invention.

FIG. 4A is a perspective view partly in section illustrating a first embodiment of the superconductive logic device according to the present invention. In FIG. 4A, the elements which are the same as those of FIG. 1A are denoted by the same reference numerals. In FIG. 4A, the insulating layer 8 and the control line 9 in FIG. 1A are not provided. That is, in the counter electrode 7, one counter electrode extension 7a serves as an input terminal for the input signal current $I_H$, while the other counter electrode extension 7b is connected directly to the ground plane 2 and, therefore, is grounded. Therefore, the input signal current $I_H$ is supplied from the counter electrode extension 7a and flows on the lower surface of the counter electrode 7 to the ground plane 2, not through the Josephson junction.

Figure 4B:
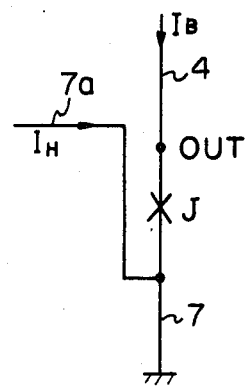
FIG. 4B is an equivalent circuit diagram of the superconductive logic device of FIG. 4A.

FIG. 4B is an equivalent circuit diagram of the superconductive logic device of FIG. 4A. As is apparent from FIG. 4B, a circuit for the input signal current $I_H$ is independent of and separated from a circuit of the Josephson junction J, so that isolation between input and output components is easy. In other words, the output signal which is obtained at the output terminal OUT, does not include the component of the input signal current $I_H$.

If a resistor (not shown) is inserted between the counter electrode 7 and the ground plane 2 (FIG. 4A), the input signal current $I_H$ flows through the resistor so as to cause a voltage drop between the terminals of the resistor. As a result, the potential at the output terminal OUT is raised and as a consequence, the input signal current $I_H$ affects the output circuit. However, in the device of FIG. 4A, this can be avoided by grounding the counter electrode 7.

Figure 4C:
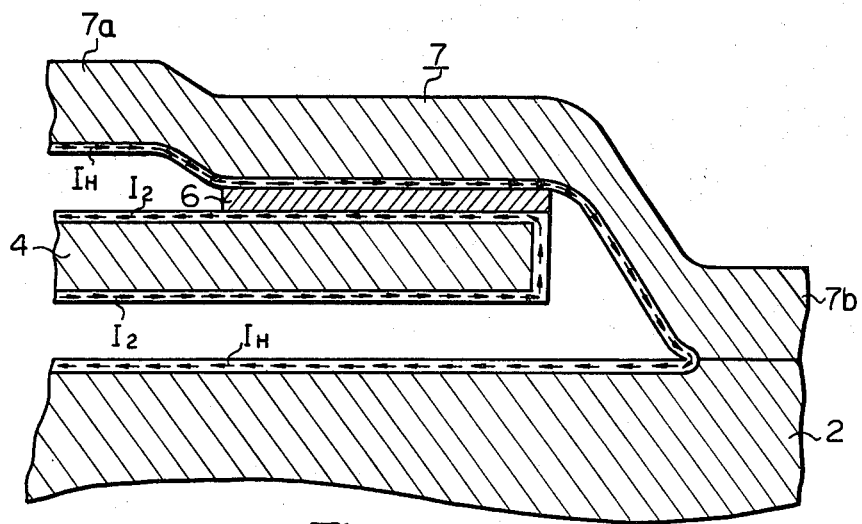
FIG. 4C is a cross-sectional view of the Josephson junction portion of FIG. 4A.

FIG. 4C is a cross-sectional view of the Josephson junction portion of FIG. 4A. In FIG. 4C, when the input signal current $I_H$ flows from the counter electrode extension 7a, the current $I_H$ flows on the lower surface of the counter electrode 7 including its extension 7b to the upper surface of the ground plane 2. In addition, an image current $I_2$, whose value is a little smaller than the input signal current $I_H$, flows on the surface of the base electrode 4. Thus, the magnetic field in the Josephson junction which corresponds to the insulating layer 6 is determined by only the two currents $I_H$ and $I_2$, in the same way as in FIG. 3. It should be noted that, in FIG. 3, the input signal current $I_H$ generates image currents which, in turn, generate the magnetic field in the junction; however, in FIG. 4C, the input signal current $I_H$ directly generates the magnetic field in the junction. Therefore, the magnetic field in the junction of FIG. 4C becomes large as compared with that of FIG. 3.

Figure 5:
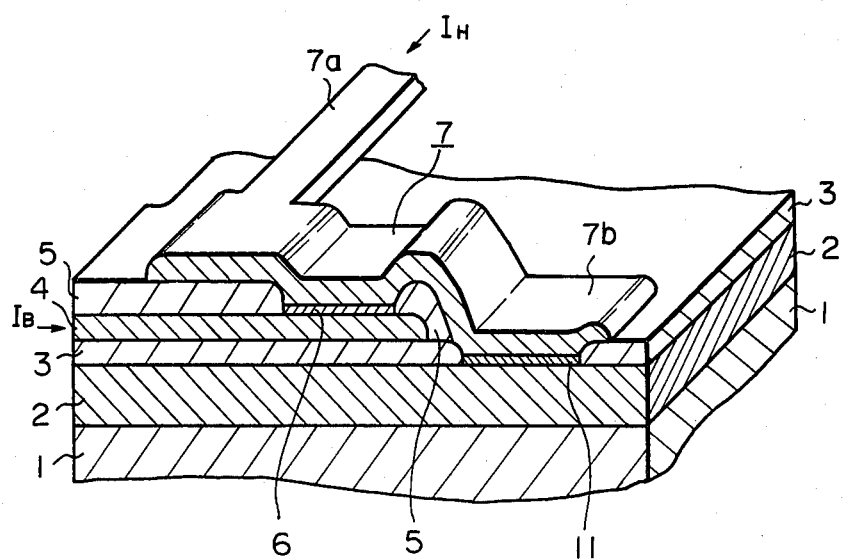
FIGS. 5, 6 and 7 are perspective views partly in section illustrating second, third and fourth embodiments of the superconductive logic device according to the present invention, respectively.
Figure 6:
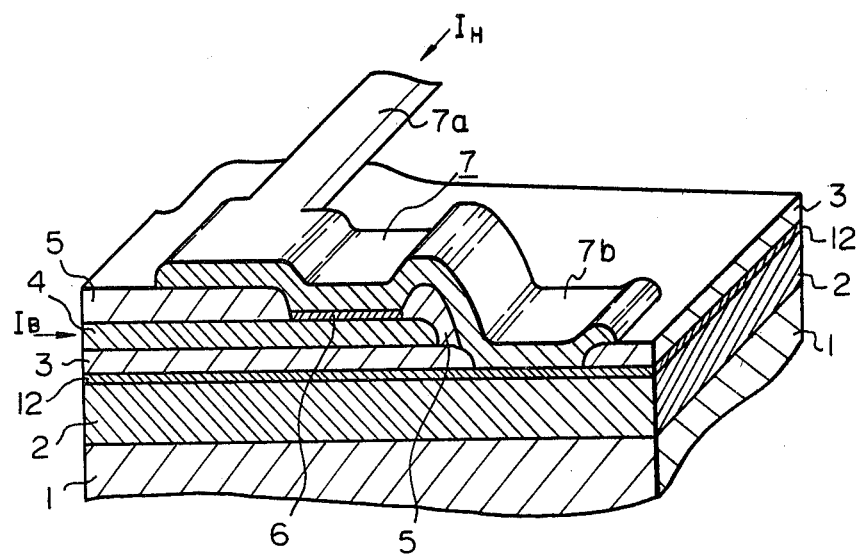
Figure 7:
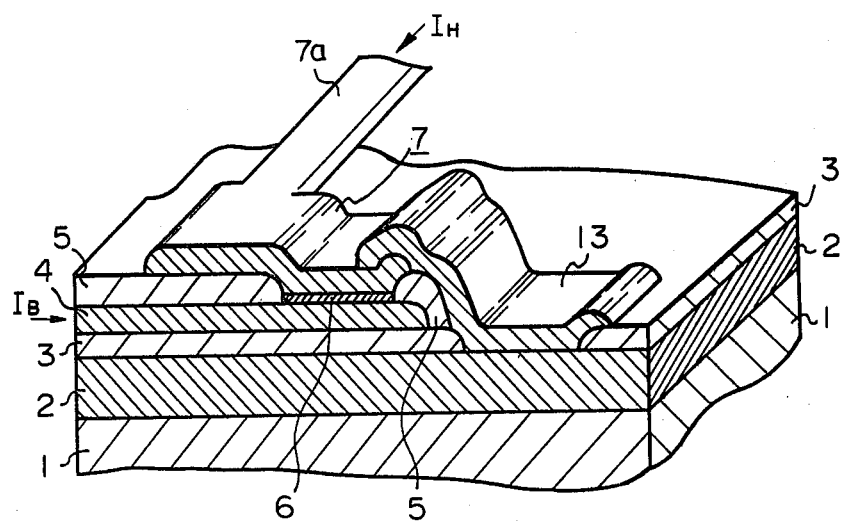

FIGS. 5, 6 and 7 are perspective views partly in section illustrating second, third and fourth embodiments of the superconductive logic device according to the present invention, respectively. In FIGS. 5, 6 and 7, the elements which are the same as those of FIG. 4A are denoted by the same reference numerals. In the second embodiment as illustrated in FIG. 5, an oxidization-resistant and low resistance material layer 11 is inserted between the ground plane 2 and the counter electrode extension 7b, while in the third embodiment as illustrated in FIG. 6, an oxidation-resistant and low resistance material layer 12 is inserted between the ground plane 2 and the insulating layer 3. In addition, in the fourth embodiment as illustrated in FIG. 7, another superconductive layer 13 which connects the counter electrode 7 to the ground plane 2 is provided. It should be noted that the number of the manufacturing steps of each of the devices of FIGS. 5, 6 and 7 are almost the same as that of the device of FIG. 4A, in spite of having an additional layer.

Next, the manufacturing steps of the superconductive logic devices according to the present invention will be explained.

FIGS. 8(1) through 8(7) are cross-sectional views for explaining the manufacturing steps of the device of FIG. 5. First, as illustrated in FIG. 8(1), a superconductive material such as niobium (Nb) is deposited as a ground plane 2 with a thickness of $2,000 \sim 3,000$ Å on an insulating substrate 1 which is made of silicon or glass. Next, as illustrated in FIG. 8(2), silicon oxide (SiO) is deposited as an insulating layer 3 with a thickness of 2,000 Å on the ground plane 2. The patterning of the insulating layer 3 is made by a lift-off process or an etching process. After that, oxide and contamination on the exposed surface of the ground plane 2 are removed by sputter etching in argon. Next, as illustrated in FIG. 8(3), an oxidation-resistant and low resistance material such as gold (Au) or gold-indium (Au-In) with a high percentage of gold, is deposited as a layer 11 with a thickness of 2,000 Å on the exposed surface of the ground plane 2 within the contact hole of the insulator 3. In this case, the resistance of the layer 11 is about on the order of $10^{-4}\Omega$, which is much less than the normal resistance of the Josephson junction, since the layer has a relatively large area and is thin. Therefore, even when a current whose value is 10 mA flows through the layer 11, the voltage drop induced by the layer 11 is on the order of less than $10^{-3}$ of the normal voltage of the junction, which causes no problem. It should be noted that, at this step, other load resistors (not shown) are also deposited. Next, after sputter etching in argon is again effected, as illustrated in FIG. 8(4), first gold of an 80 Å thickness and then lead indium (Pb-In, indium component of 10 weight percent) of a 2,000 Å thickness in this order are evaporated as a base electrode 4. Next, the evaporated surface of the base electrode 4 is oxidized by an RF plasma oxidization process and, after that, the patterning of the electrode 4 is made by a lift-off process. Next, as illustrated in FIG. 8(5), SiO of a 3,000 Å thickness indicated by reference 5 is deposited and patterned so as to demarcate the junction area by a lift-off process or an etching process. Next, as illustrated in FIG. 8(6), the junction area of the base electrode 4 is again oxidized by an RF plasma oxidization process, so that an insulating layer 6 which is made of (PbO+In$_2$O$_3$) of about 30 Å thickness is formed. The insulating layer 6 constitutes the afore-mentioned Josephson junction. In this plasma oxidization process, if there is no layer 11, the area of the ground plane 2 corresponding to the layer 11 which is, in this case, exposed, is also oxidized, so that a Josephson junction is formed there and a counter electrode 7 which will be found in the next step can not be grounded. That is, the layer 11 prevents such a Josephson junction from being formed. Next, as illustrated in FIG. 8(7), a counter electrode 7 is formed by successively evaporating lead (Pb) of a 2,000 Å thickness, gold (Au) of an 80 Å thickness and lead (Pb) of a 2,000 Å thickness in this order. The patterning of this evaporated layer is made by a lift-off process. Thus, the device of FIG. 5 is completed.

The manufacturing steps of the devices of FIGS. 4A, 6 and 7 are similar to those of the device of FIG. 5 as explained above.

In the manufacturing steps of the device of FIG. 6, the deposition process of an oxidization-resistant and low resistance layer 12, which is, for example, gold (Au) of a 100 Å thickness, is added after the step as illustrated in FIG. 8(1). Of course, in this case, the deposition process of the layer 11 as illustrated in FIG. 8(3) is omitted.

It should be noted that the above-mentioned gold layers 11 (FIG. 5) and 12 (FIG. 6) must be thin enough as compared with a penetration depth (skin depth) λ of the magnetic field to allow for the highest frequency signal.

The manufacturing steps of the device of FIG. 7 are the same as those of the device of FIG. 4A, except for an additional manufacturing step for depositing an additional superconductive layer 13.

Figure 9A:
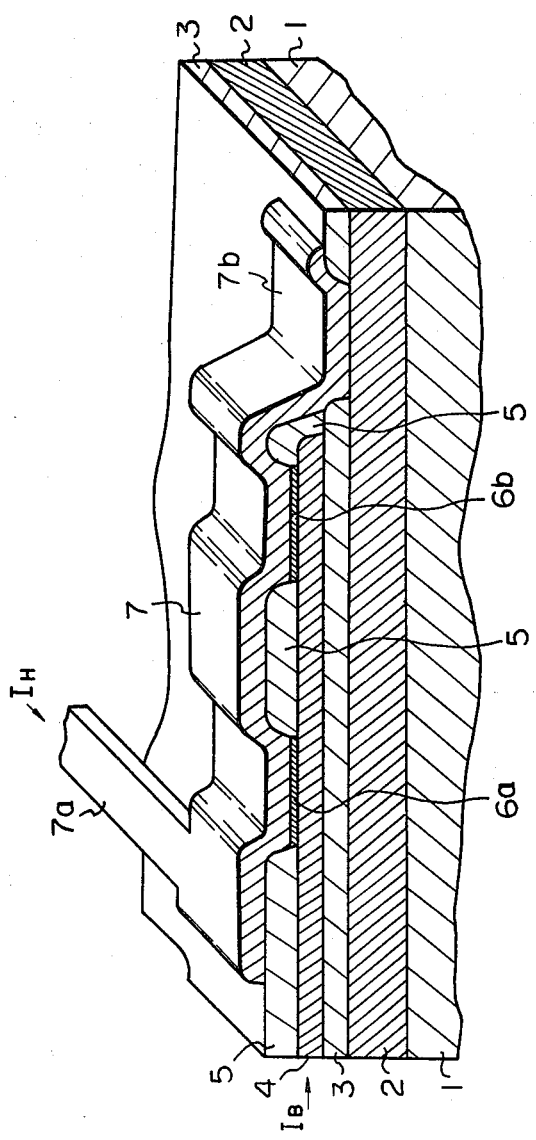
FIG. 9A is a perspective view partly in section illustrating a fifth embodiment of the superconductive logic device according to the present invention.
Figure 10A:
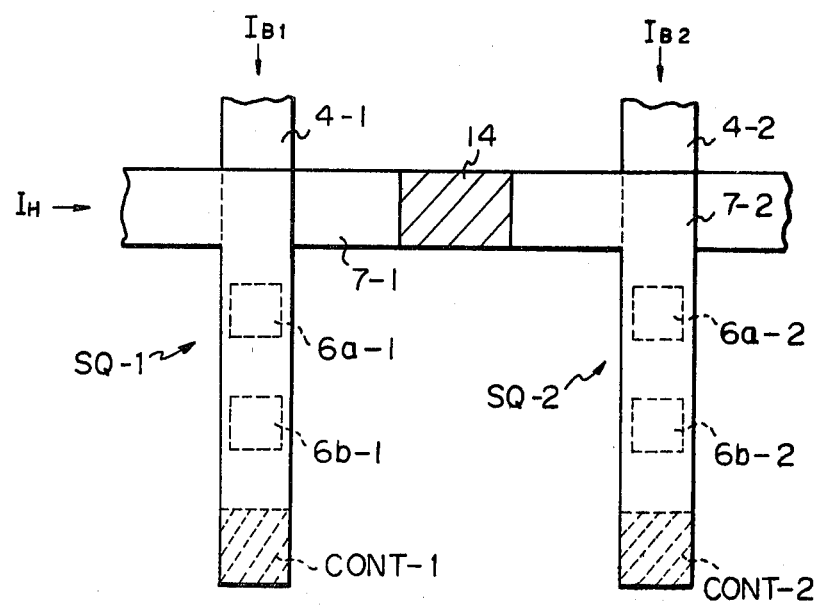
FIG. 10A is a plan view illustrating a sixth embodiment of the superconductive logic device according to the present invention.

The present invention can be also applied to a superconducting quantum interference device (SQUID) with two or more junctions, which is illustrated in FIGS. 9A and 10A.

Figure 9B:
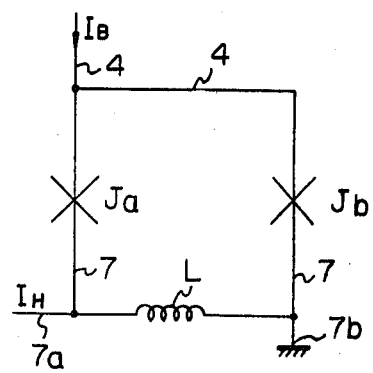
FIG. 9B is an equivalent circuit diagram of the device of FIG. 9A.

FIG. 9A is a perspective view partly in section illustrating a fifth embodiment of the superconductive logic device according to the present invention. In FIG. 9A, a SQUID with two junctions using the device of FIG. 4A is illustrated. That is, two insulating layers 6a and 6b which are the same as the insulating layer 6 of FIG. 4A are provided so as to form two Josephson junctions. An input signal current $I_H$ flows from the counter electrode extension 7a, through the counter electrode 7 over the two junctions which correspond to the layers 6a and 6b to the ground plane 2. In addition, the voltage and zero-voltage states of the two junctions are controlled, depending upon whether or not a magnetic field induced by the input signal current $I_H$ interlinks with a magnetic flux loop formed by the layer 6a, the counter electrode 7, the layer 6b and the base electrode 4. FIG. 9B is an equivalent circuit diagram of the device of FIG. 9A. In FIG. 9B, L is the inductance existing in the counter electrode 7 between the two junctions. Such a SQUID as illustrated in FIGS. 9A and 9B has a higher sensitivity as compared with the device with one junction of FIG. 4A, 5, 6 or 7, so that each of the junctions $J_a$ and $J_b$ can be reduced, in other words, each of the layers 6a and 6b, can be small in area.

Figure 10B:
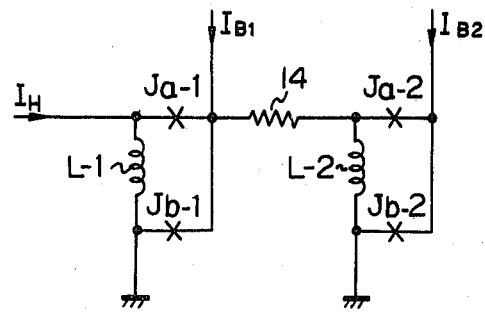
FIG. 10B is an equivalent circuit diagram of the device of FIG. 10A.

FIG. 10A is a plan view illustrating a sixth embodiment of the superconductive logic device according to the present invention and FIG. 10B is an equivalent circuit diagram of the device of FIG. 10A. In FIG. 10A, two SQUIDs SQ-1 and SQ-2 are connected by a load resistor 14. Each of the SQUIDs SQ-1 and SQ-2 are the same as the SQUID of FIG. 9A. In FIG. 10A, contact holes CONT-1 and CONT-2 are used for connecting the counter electrodes 7-1 and 7-2, respectively, to the ground plane 2 (not shown).

Figure 11:
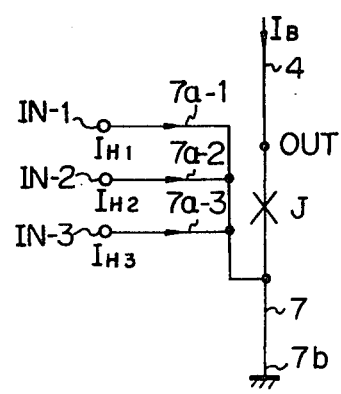
FIG. 11 is an equivalent circuit diagram illustrating a seventh embodiment of the superconductive logic device according to the present invention.

According to the present invention, an arbitrary number of input terminals can be provided, as illustrated in FIG. 11 which is an equivalent circuit diagram illustrating a seventh embodiment of the superconductive logic device according to the present invention. In FIG. 11, which is similar to FIG. 4B, three input terminals IN-1, IN-2 and IN-3 are provided so as to perform an OR or AND logic operation for three input signal currents $I_{H1}$, $I_{H2}$ and $I_{H3}$. In this case, the input terminals IN-1, IN-2 and IN-3 are connected to three counter electrode extensions 7a-1, 7a-2 and 7a-3 which are the same as the counter electrode extension 7a of FIG. 4A, 5, 6 or 7.

For example, if one of the input signal currents $I_{H1}$, $I_{H2}$ and $I_{H3}$ flows so as to change the critical current of the Josephson junction J from $I_C$ to $I_C'$ which is a little smaller than the bias current $I_B$, that is, so as to change the state of the junction J from the zero-voltage state to the voltage state (see, FIG. 1B), an OR logic operation can be effected for the three input signals $I_{H1}$, $I_{H2}$ and $I_{H3}$. Contrary to this, if all of the input signal currents $I_{H1}$, $I_{H2}$ and $I_{H3}$ flow simultaneously so as to change the critical current of the junction J from $I_c$ to $I_c'$, an AND logic operation can be effected for the three input signals $I_{H1}$, $I_{H2}$ and $I_{H3}$.

According to the present invention, an arbitrary number of output terminals or output circuits can be provided, as long as the divided output current at each output terminal can drive a next-stage gate. However, since the counter electrode is connected to the ground plane, it is necessary to arrange the output circuits in parallel. If the output circuits are arranged in series, the potential of a point connecting the output circuits to the counter electrode is changed so that the counter electrode cannot be grounded. In other words, an input signal current $I_H$ leaks into the output circuits.

In addition, if n output circuits in parallel are provided, each output current is reduced by a factor of n. As a result, a problem of loss of the driving ability for the next-stage gates occurs. That is, the output currents are supplied from the bias current $I_B$ which can not be arbitrarily increased. This is because the bias current $I_B$ must be smaller than the critical current $I_C$ when $I_H=0$. Therefore, each output current whose value is reduced by a factor of n may not be able to drive the next-stage gate.

Figure 12:
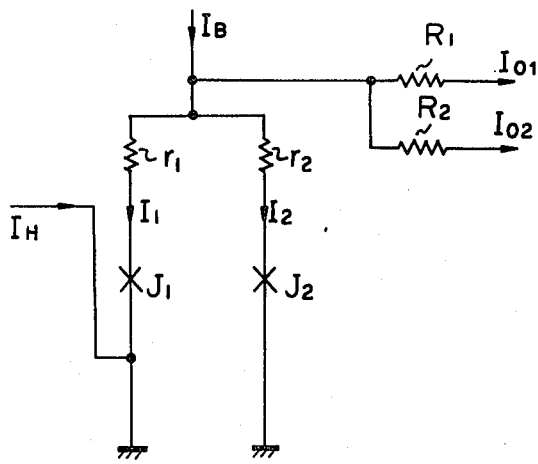
FIG. 12 is an equivalent circuit diagram illustrating an eighth embodiment of the superconductive logic device according to the present invention.

FIG. 12 is an equivalent circuit diagram illustrating an eighth embodiment of the superconductive logic device according to the present invention. In this embodiment, the above-mentioned problem is eliminated. In FIG. 12, which is similar to FIG. 4B, two resistors $r_1$ and $r_2$ are provided for dividing the bias current $I_B$, and $R_1$ and $R_2$ the resistances of two output circuits. Josephson junction $J_1$ is the same as the counter electrode direct-coupled type Josephson junction J of FIG. 4B which receives an input signal current $I_H$, while Josephson junction $J_2$ does not require the input signal current $I_H$.

The operation of the circuit of FIG. 12 is explained. If $r_1 = r_2$, then the same currents $I_1$ and $I_2$ flow through the junctions $J_1$ and $J_2$, respectively. In this case, the currents $I_1$ and $I_2$ are selected so as to be a little smaller than a critical current $I_C$ of the junction $J_1$ when $I_H = 0$. In addition, it should be noted that the bias current $I_B$ in FIG. 12, which equals $I_1 + I_2$, is twice the bias current $I_B$ in FIG. 4B. Even in this case, since $I_1 < I_C$ and $I_2 < I_C$, the junctions $J_1$ and $J_2$ are both in the zero-voltage state and, in addition, since $R_1$ and $R_2 > r_1$ and $r_2$, respectively, output currents $I_{01}$ and $I_{02}$ are both almost zero. Next, when the input signal current $I_H$ flows from the counter electrode (not shown) over the junction $J_1$ to the ground plane (not shown), the critical current of the junction $J_1$ is changed from $I_C$ to $I_C'(>I_1)$, and the junction $J_1$ is placed in the voltage state. In this state, since $r_1$ and $r_2$ are selected so as to be smaller than the normal resistance of the junctions $J_1$ and $J_2$, a load line is set up shown as dotted line C in FIG. 1B and most of the current $I_1$ is switched from the junction $J_1$ to the junction $J_2$, so as to increase the current $I_2$ flowing through the junction $J_2$. As a result, $I_2 > I_C$ and, accordingly, the junction $J_2$ also becomes in the voltage state, causing the bias current $I_B$ to leak into the output circuits which correspond to $R_1$ and $R_2$. If the resistances $R_1$ and $R_2$ of the output circuits satisfy $R_1 = R_2$, each of the output currents $I_{01}$ and $I_{02}$ is almost half of the bias current $I_B$, which is, however, twice as large as the bias current $I_B$ in the circuit of FIG. 4B. Thus, a counter electrode direct-coupled device with twice the driving ability for output circuits can be obtained.

In the embodiment of FIG. 12, the SQUID with two junctions of FIGS. 9A and 9B or a device with more than two junctions can be used instead of the Josephson junction $J_1$.

As is easily understood from FIG. 12, if n parallel circuits each of which comprises the junction $J_2$ and the resistor $r_2$ are arranged in series in FIG. 12, a counter electrode direct-coupled device with n times as large a driving ability for output circuits can be obtained. Therefore, in this case, n output circuits can be provided.

The counter electrode direct-coupled type Josephson device according to the present invention can be applied to various kinds of logic gates, such as an exclusive OR (hereinafter referred to as EXOR) logic gate, an OR logic gate or a flip-flop circuit.

Figure 13A:
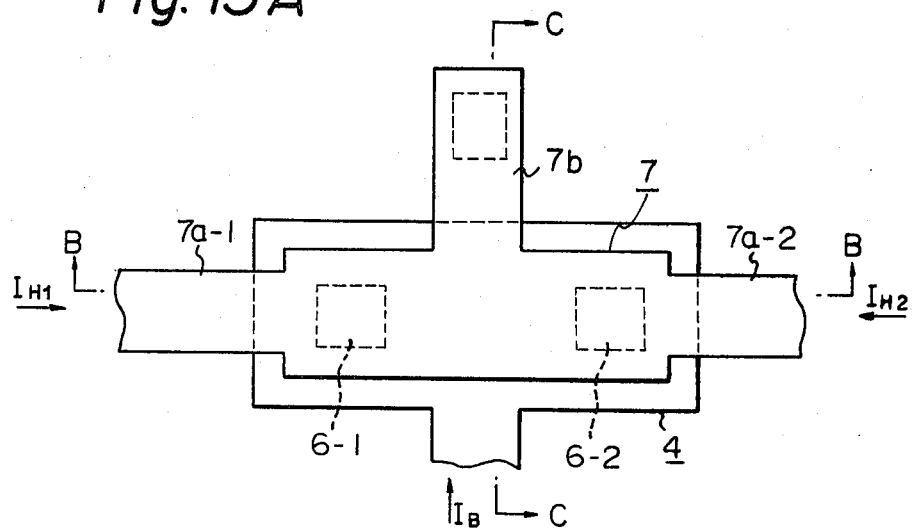
FIG. 13A is a plan view illustrating a ninth embodiment of the superconductive logic device according to the present invention.
Figure 13B:
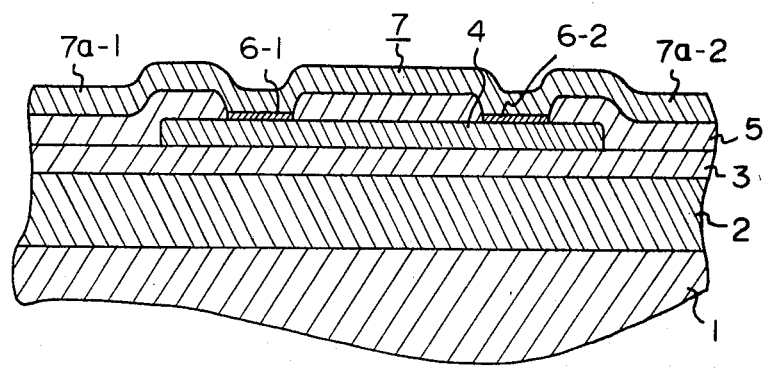
FIGS. 13B and 13C are cross-sectional views taken along the lines B—B and the lines C—C, respectively, of FIG. 13A.
Figure 13C:
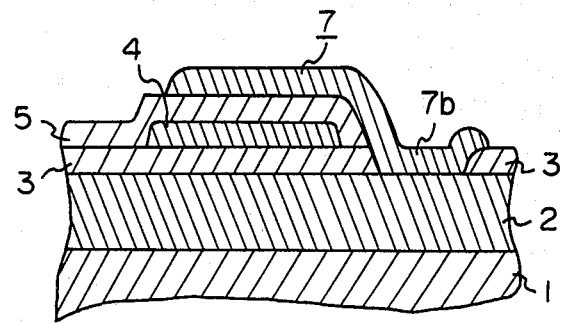

FIG. 13A is a plan view illustrating a ninth embodiment of the superconductive logic device according to the present invention, which is used for performing an EXOR logic operation. IN addition, FIGS. 13B and 13C are cross-sectional views taken along the lines B—B and the lines C—C, respectively, of FIG. 13A. As illustrated in FIGS. 13A, 13B and 13C, two Josephson junctions are formed by a base electrode 4, a counter electrode 7 and two insulating layers 6-1 and 6-2, and the counter electrode 7 is also grounded by connecting its extension 7b to a ground plane 2.

As illustrated in FIG. 13A, the base electrode 4 is T-shaped and, in addition, the counter electrode 7 extends over the arm portion of the base electrode 4. Further, the insulating layers 6-1 and 6-2 are located at both sides of the arm portion. Two extensions 7a-1 and 7a-2 of the counter electrode 7 serve as input terminals for two input signal currents $I_{H1}$ and $I_{H2}$, while the leg portion of the base electrode 4 serves as an input terminal for a bias current $I_B$, as well as an output terminal.

The operation of the device of FIGS. 13A, 13B and 13C is now explained. The bias current $I_B$ flows from the leg portion of the base electrode 4 through the arm portion thereof, continuing through the insulating layers 6-1 and 6-2, the counter electrode 7 and its extension 7b to the ground plane 2. In this case, the current $I_B$ is selected so as to place both of the junctions in the zero-voltage state when the input signal currents $I_{H1}$ and $I_{H2}$ are both zero. The input signal currents $I_{H1}$ and $I_{H2}$ flow from the extensions 7a-1 and 7a-2 of the counter electrode 7 through the extension 7b to the ground plane 2. When either the input signal current $I_{H1}$ or the input signal current $I_{H2}$ flows, the current acts on both of the junctions with a magnetic field so as to decrease the critical current $I_C$ thereof. As a result, $I_B > I_C$ and accordingly, the junctions are placed in the voltage state. Contrary to the above, when both of the signal currents $I_{H1}$ and $I_{H2}$ flow, each current acts on both of the junctions with a magnetic field. However, the two magnetic fields induced by the currents $I_{H1}$ and $I_{H2}$ oppose each other, since the currents flow in opposite directions to each other in the counter electrode 7. Therefore, this state is the same as the state in which the input signal currents $I_{H1}$ and $I_{H2}$ are both zero. Now, it is assumed that the flowing and nonflowing states of an input signal current are defined as "1" and "0", respectively, and that the voltage and zero-voltage states of the junctions are defined as "1" and "0", respectively. As a result, in the above-mentioned case, if the states of the input signal current $I_{H1}$ and $I_{H2}$ are "0, 0" or "1, 1", the state of the junctions is "0", while, if the states of the input signal currents $I_{H1}$ and $I_{H2}$ are "0, 1" or "1, 0", the state of the junctions is "1". Thus, this means that an EXOR logic operation is performed.

Figure 13D:
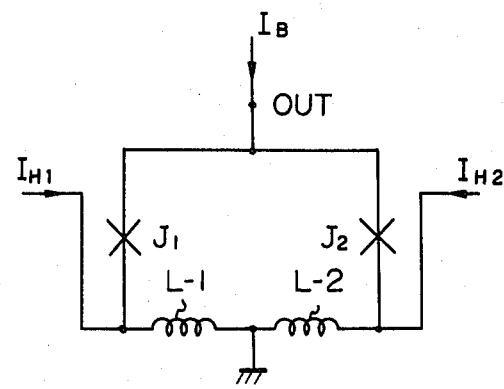
FIG. 13D is an equivalent circuit diagram of the device of FIG. 13A.

FIG. 13D is an equivalent circuit diagram of the device of FIG. 13A. As is understood from FIG. 13D, the function of the input signal current $I_{H1}$ or $I_{H2}$ is similar to that of a so-called DC SQUID which is illustrated in FIGS. 9A and 9B, except that two input terminals are employed in FIG. 13D.

In the ninth embodiment, it should be noted that at first, some of the signal currents $I_{H1}$ and $I_{H2}$ are supplied and, after that, the bias current $I_B$ is supplied. This is because if one of the input signal currents $I_{H1}$ and $I_{H2}$ flows at the same time that the bias current $I_B$ flows, the junctions $J_1$ and $J_2$ are placed in the voltage state and, after that, even when the other current flows, the junctions remain in the voltage state so that an EXOR operation is not performed for the input signal currents "1, 1".

In the ninth embodiment, instead of each of the junctions $J_1$ and $J_2$, the SQUID of FIGS. 9A and 9B or a SQUID with more than two junctions can be also used.

Figure 14:
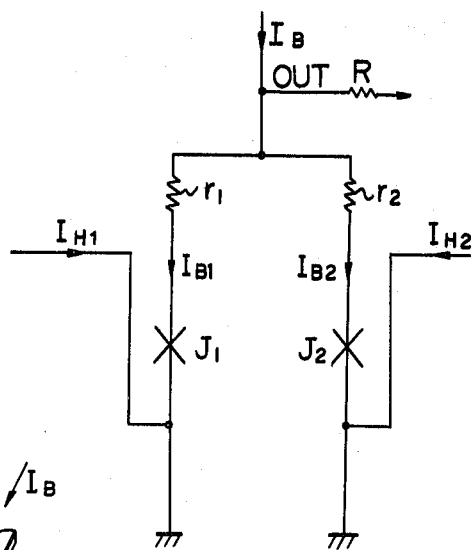
FIG. 14 is an equivalent circuit diagram illustrating a tenth embodiment of the superconductive logic device according to the present invention.

FIG. 14 is an equivalent circuit diagram illustrating a tenth embodiment of the superconductive logic device according to the present invention, which is used for performing an OR logic operation. FIG. 14 is similar to FIG. 13D for performing an EXOR logic operation. However, in the circuit of FIG. 14, an input signal current $I_{H1}$ acts on only the Josephson junction $J_1$ with a magnetic field, while another signal current $I_{H2}$ acts on only the Josephson junction $J_2$ with a magnetic field.

In FIG. 14, resistors $r_1$ and $r_2$ which also represent the resistance values thereof are used for determining the ratio of bias currents $I_{B1}$ and $I_{B2}$ each of which flow through the junctions $J_1$ and $J_2$, respectively, and are selected so as to be lower than the normal resistances of the junctions $J_1$ and $J_2$. If $r_1$ equals $r_2$, the bias currents are the same as each other. Of course, in this case $I_B = I_{B1} + I_{B2}$. Each of the bias currents $I_{B1}$ and $I_{B2}$ is selected so as to be a little smaller than the critical value of the junctions $J_1$ and $J_2$, respectively, when the input signal currents $I_{H1}$ and $I_{H2}$ are both zero.

Therefore, when the input signal currents $I_{H1}$ and $I_{H2}$ are both zero, the junctions $J_1$ and $J_2$ are both in the zero-voltage state. In this case, since $r_1$ and $r_2 << R$ where R is the resistance of the output circuit, most of the bias current $I_B$ flows through the junctions $J_1$ and $J_2$. In addition, when one of the input signal currents, for example, the input signal current $I_{H1}$ flows, the critical current of the junction $J_1$ is reduced so as to place the junction $J_1$ in the voltage state. As a result, the bias current $I_{B1}$ flowing through the junction $J_1$ is switched from the junction $J_1$ to the junction $J_2$, so as to increase the bias current $I_{B2}$ flowing through the junction $J_2$. Therefore, the junction $J_2$ also is placed in the voltage state, so that most of the current $I_B$ leaks from the output terminal OUT into the output circuit whose resistance is indicated by R. As a result, the output circuit is driven. Similarly, when both of the input signal currents $I_{H1}$ and $I_{H2}$ flow, both of the junctions $J_1$ and $J_2$ are placed in the voltage state, so that most of the bias current $I_B$ leaks into the output circuit. Thus, an OR logic operation is performed for the input signal currents $I_{H1}$ and $I_{H2}$.

It should be noted that the above-mentioned device of FIG. 14 can be used in combination with the device of FIG. 11 or 12. For example, if the device of FIG. 14 is combined with the device of FIG. 11, a multi-input OR logic circuit can be realized.

In addition, in FIG. 14, instead of each of the junctions $J_1$ and $J_2$, the SQUID, as illustrated in FIGS. 9A and 9B or a SQUID with more than two junctions, can be used.

Figure 15A:
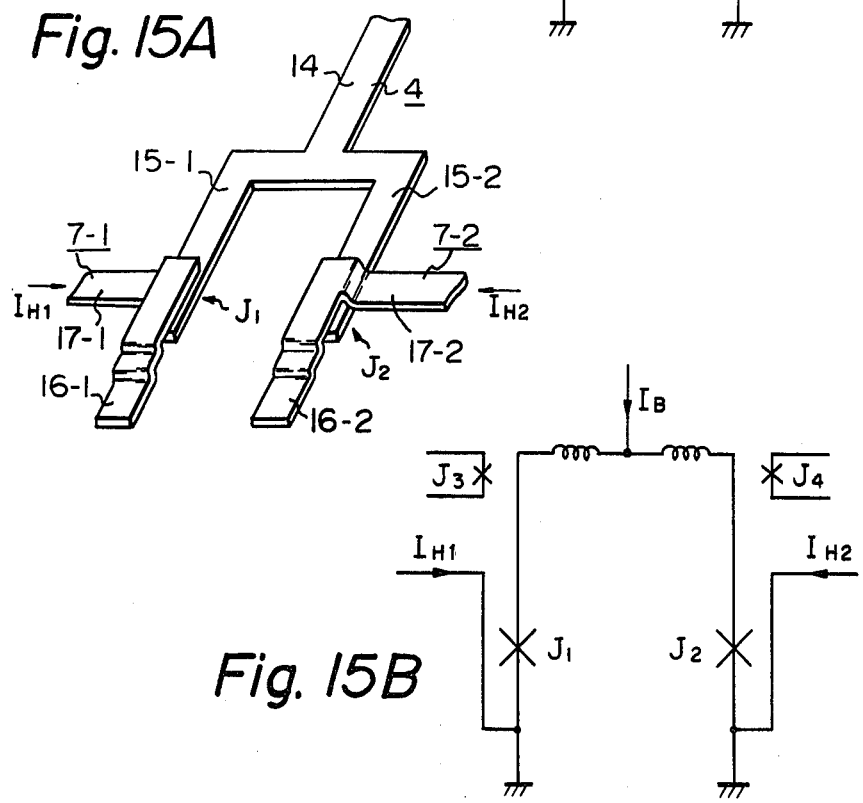
FIG. 15A is a perspective view illustrating an eleventh embodiment of the superconductive logic device according to the present invention.

FIG. 15A is a perspective view illustrating the base electrode and counter electrodes of an eleventh embodiment of the superconductive logic device according to the present invention, which is used for performing a flip-flop operation. In FIG. 15A, only a base electrode 4 and two counter electrodes 7-1 and 7-2 are illustrated and other layers such as insulating layers are omitted. The base electrode 4 is fork-shaped and receives a bias current $I_B$ at the leg portion 14 thereof, while the counter electrodes 7-1 and 7-2 are L-shaped and arranged along the branch portions 15-1 and 15-2 of the base electrode 4. In the L-shaped counter electrodes 7-1 and 7-2, arms 16-1 and 16-2 are electrically connected to a ground plane (not shown), while other arms 17-1 and 17-2 which project outwardly serve as input terminals for input signal currents $I_{H1}$ and $I_{H2}$. Josephson junctions $J_1$ and $J_2$ are formed by the base electrode 4 the counter electrodes 7-1 and 7-2 and insulating layers therebetween (not shown).

Figure 15B:
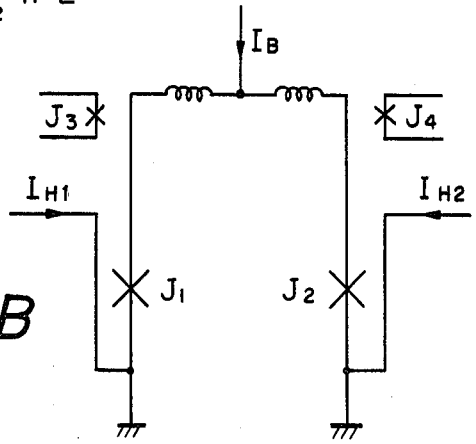
FIG. 15B is an equivalent circuit diagram of the device of FIG. 15A.

FIG. 15B is an equivalent circuit diagram of the device of FIG. 15A. FIG. 15B is similar to FIG. 14. However, in FIG. 14, each of the bias currents $I_{B1}$ and $I_{B2}$ is selected so as to be a little lower than the critical current $I_C$, while in FIG. 15B the bias current $I_B$ is selected so as to be a little lower than the critical current. In FIG. 15B, $J_3$ and $J_4$ are Josephson junctions for output circuits and are not shown in FIG. 15A.

The operation of the device of FIGS. 15A and 15B is explained. When the bias current $I_B$ flows, an equal current flows through each of the junctions $J_1$ and $J_2$, since two inductances exist symmetrically in this circuit. In this state, when one of the input signal currents (for example, the current $I_{H1}$) flows, the critical current of the junction $J_1$ is decreased so that the junction $J_1$ is placed in the voltage state. As a result, the current which is flowing through the junction $J_1$ is switched from the junction $J_1$ to the junction $J_2$ which is in the zero-voltage state. Thus, most of the bias current $I_B$ flows through the junction $J_2$. However, even in this state, the junction $J_2$ remains in the zero-voltage state, because of the above-mentioned condition. In addition, since most of the bias current $I_B$ flows through the junction $J_2$, the junction $J_1$ returns to the zero-voltage state. However, since the circuit has self-maintaining characteristics, the above-mentioned state, in which most of the bias current $I_B$ flows through the junction $J_2$, remains, even when the input signal current $I_{H1}$ returns to zero. Next, when the input signal current $I_{H2}$ is supplied so as to change the junction $J_2$ from the zero-voltage state to the voltage state, the bias current $I_B$ is switched from the junction $J_2$ to the junction $J_1$. Thus, the flip-flop operation has been completed.

Output signals can be obtained from the output circuits, including the Josephson junctions $J_3$ and $J_4$, since the current flowing through the junction $J_1$ or $J_2$ drives the junction $J_3$ or $J_4$.

In the eleventh embodiment as illustrated in FIGS. 15A and 15B, instead of each of the junctions $J_1$ and $J_2$, the SQUID as illustrated in FIGS. 9A and 9B or a SQUID with more than two junctions, such as demonstrated by FIG. 10B, can be used.

As explained hereinbefore, the present invention has the following advantages as compared with the conventional devices:

(1) A superconductive logic device with a simple structure and with easy isolation of input and ouput components can be obtained, since the control line used in the conventional device can be omitted, and the input circuit and the output circuit therefor are separated from each other.

(2) A superconductive logic device for performing various types of logic operations with a simple structure can be obtained.

We claim:
1. A superconductive logic device comprising:
a superconductive ground plane;
a first insulating layer formed on said superconductive ground plane;
a superconductive base electrode, for receiving a bias current, formed on said first insulating layer;
second and third insulating layers formed on different portions of said superconductive base electrode, said second insulating layer being thicker than said third insulating layer;
a superconductive counter electrode formed on said second and third insulating layers;
a first superconductive counter electrode extension extending from said superconductive counter electrode and electrically connected to said superconductive ground plane; and a second superconductive counter electrode extension extending from said superconductive counter electrode and serving as an input terminal for receiving an input signal current;

at least one Josephson junction being formed, said Josephson junction comprising said superconductive base electrode, said superconductive counter electrode and said third insulating layer formed therebetween, the input signal current being supplied to said superconductive ground plane through said second superconductive counter electrode extension, said superconductive counter electrode and said first superconductive counter electrode extension, so as to apply a magnetic field to said at least one Josephson junction.

2. A superconductive logic device comprising:

a superconductive ground plane;

a first insulating layer formed on said superconductive ground plane;

a T-shaped superconductive base electrode having a leg portion for receiving a bias current and having an arm portion;

second and third insulating layers formed on different portions of said T-shaped superconductive base electrode, said third insulating layer being located on both sides of said arm portion of said T-shaped superconductive base electrode, said second insulating layer being thicker than said third insulating layer; and a superconductive counter electrode formed on said second and third insulating layers, said superconductive counter electrode having first, second and third extensions, said second and third extensions for receiving two input signals and extending over the arm portion of said T-shaped superconductive base electrode, said first extension located at an intermediate position thereof and connected to said superconductive ground plane;

at least two Josephson junctions being formed, said Josephson junctions comprising said T-shaped superconductive base electrode, said superconductive counter electrode and said third insulating layer formed therebetween, the two input signals being supplied to said superconductive ground plane through said superconductive counter electrode, so as to apply a magnetic field to said at least two Josephson junctions.

3. A superconductive logic device comprising:

a superconductive ground plane;

a first insulating layer formed on said superconductive ground plane;

a forked superconductive base electrode, having a leg portion for receiving a bias current and having two arm portions, formed on said first insulating layer;

second and third insulating layers formed on different portions of said forked superconductive base electrode, said third insulating layer being located on both said arm portions of said forked superconductive base electrode, said second insulating layer being thicker than said third insulating layer; and two L-shaped superconductive counter electrodes formed on said second and third insulating layers, each said L-shaped superconductive counter electrode having a first extension connected to said superconductive ground plane and a second extension for receiving an input signal;

at least two Josephson junctions being formed, said Josephson junctions comprising said forked superconductive base electrode, said L-shaped superconductive counter electrode and said third insulating layer formed therebetween, the input signals being supplied to said superconductive ground plane through said each said L-shaped superconductive counter electrode, so as to apply a magnetic field to said at least two Josephson junctions.

4. A device as set forth in claim 1, 2 or 3, further comprising an oxidization-resistant and low-resistance material layer formed between said superconductive ground plane and said first superconductive counter electrode extension.

5. A device as set forth in claim 1, 2 or 3, further comprising an oxidization-resistant and low-resistance material layer form between said superconductive ground plane and said first insulating layer, said oxidization-resistant and low-resistance material layer being connected to said first superconductive counter electrode extension.

6. A device as set forth in claim 1, 2 or 3, further comprising a superconductive layer, formed on said superconductive counter electrode, for connecting said superconductive counter electrode to said superconductive ground plane.

7. A superconductive logic device comprising:

a plurality of series circuits, each said series circuit comprising a resistor and a counter electrode direct-coupled Josephson junction connected in series; and a connection point for connecting said series circuits and for producing an output signal;

said counter electrode direct-coupled Josephson junction comprising:

a superconductive ground plane;

a first insulating layer formed on said superconductive ground plane;

a superconductive base electrode, for receiving a bias current, formed on said first insulating layer;

second and third insulating layers formed on different portions of said superconductive base electrode, said second insulating layer being thicker than said third insulating layer;

a superconductive counter electrode formed on said second and third insulating layers;

a first superconductive counter electrode extension extending from said superconductive counter electrode and electrically connected to said superconductive ground plane; and a second superconductive counter electrode extension extending from said superconductive counter electrode and serving as an input terminal for receiving an input signal current, the input signal current being supplied to said superconductive ground plane through said second superconductive counter electrode extension, said superconductive counter electrode and said first superconductive counter electrode extension, so as to apply a magnetic field to said counter electrode direct-coupled Josephson junction.

8. A superconductive logic device comprising:

a first circuit comprising a first resistor and a counter electrode direct-coupled Josephson junction operatively connected in series;

at least one second circuit, each comprising a second resistor and another type Josephson junction in series, said second circuit being operatively connected to said first circuit in parallel; and a connection point, for connecting said first and second circuits, for receiving a bias current and for providing an output signal;

said counter electrode direct-coupled Josephson junction comprising:
a superconductive ground plane;
a first insulating layer formed on said superconductive ground plane;
a superconductive base electrode, for receiving a bias current, formed on said first insulating layer;
second and third insulating layers formed on different portions of said superconductive base electrode, said second insulating layer being thicker than said third insulating layer;
a superconductive counter electrode formed on said second and third insulating layers; a first superconductive counter electrode extension extending from said superconductive counter electrode and electrically connected to said superconductive ground plane; and
a second superconductive counter electrode extension extending from said superconductive counter electrode and serving as an input terminal for receiving an input signal current, the input signal current being supplied to said superconductive ground plane through said second superconductive counter electrode extension, said superconductive counter electrode and said first superconductive counter electrode extension, so as to apply a magnetic field to said counter electrode direct-coupled Josephson junction.

9. A device as set forth in claim 7 or 8, wherein said counter electrode direct-coupled Josephson junction further comprises an oxidization-resistant and low-resistance material layer formed between said superconductive ground plane and said first superconductive counter electrode extension.

10. A device as set forth in claim 7 or 8, wherein said counter electrode direct-coupled Josephson junction further comprises an oxidization-resistant and low-resistance material layer formed between said superconductive ground layer and said first insulating layer, said oxidization-resistant and low-resistance material layer being connected to said first superconductive counter electrode extension.

11. A device as set forth in claim 7 or 8, wherein said counter electrode direct-coupled Josephson junction further comprises a superconductive layer, formed on said superconductive counter electrode, for connecting said superconductive counter electrode to said superconductive ground plane.

12. A device as set forth in claim 1, 2, 3, 7 or 8, wherein said superconductive counter electrode has one or more input terminals.

13. A device as set forth in claim 1, 2, 3, 7 or 8, wherein said superconductive base electrode has one or more output terminals.

14. A superconductive logic device, operatively connectable to receive an input and a bias signal, comprising:
an output connection point for receiving the bias signal and for providing an output signal; and
a SQUID circuit, operatively connected to said output connection point, comprising:
a superconductive ground plane;
a first insulating layer formed on said superconductive ground plane;
a superconductive base electrode, formed on said first insulating layer, for receiving the bias signal;
second and third insulating layers formed on different regions of said superconductive base electrode, said second insulating layer being thicker than said first insulating layer, said third insulating layer forming first and second discrete regions on said superconductive base electrode; and
a superconductive counter electrode formed on said second and third insulating layers, said superconductive counter electrode having a first superconductive counter electrode extension electrically connected to said superconductive ground plane, and a second superconductive counter electrode extension serving as an input terminal for receiving the input signal;
said SQUID circuit being formed by at least two counter electrode direct-coupled Josephson junctions, said at least two counter electrode direct-coupled Josephson junctions being operatively connected in parallel and comprising said superconductive base electrode, said superconductive counter electrode and said first and second discrete regions of said third insulating layer formed therebetween, the input signal being supplied to said superconductive ground plane through said superconductive counter electrode, so as to apply a magnetic field to said at least two counter electrode direct-coupled Josephson junctions.

15. A superconductive logic device, operatively connectable to receive an input signal and a bias signal, comprising:
a first SQUID circuit, operatively connectable to receive the input signal at a first node and operatively connectable to receive the bias signal at a second node, said SQUID circuit providing a first output signal at said second node;
a second SQUID circuit, operatively connectable to receive the bias signal at a third node, said second SQUID circuit providing a second output signal at said third node; and
a resistor, operatively connected to said first SQUID circuit at said second node and operatively connected to said second SQUID circuit at a fourth node;
each of said first and second SQUID circuits comprising:
a superconductive ground plane;
a first insulating layer formed on said superconductive ground plane;
a superconductive base electrode, formed on said first insulating layer, for receiving the bias signal;
second and third insulating layers formed on different regions of said superconductive base electrode, said second insulating layer being thicker than said third insulating layer, said third insulating layer forming first and second discrete regions on said superconductive base electrode;
a superconductive counter electrode formed on said second and third insulating layers, said superconductive counter electrode having a first superconductive counter electrode extension electrically connected to said superconductive ground plane, and a second superconductive counter electrode extension electrically connected to said superconductive ground plane, said second superconductive counter electrode extension serving as an input terminal for the respective one of said first and second SQUID circuits;

said first and second SQUID circuits each being formed by at least two counter electrode direct-coupled Josephson junctions, said counter electrode direct-coupled Josephson junctions being operatively connected in parallel and comprising said superconductive base electrode, said superconductive counter electrode and said first and second discrete regions of said third insulating layer formed therebetween, the input signal being supplied to said superconductive ground plane through said superconductive counter electrode, so as to apply a magnetic field to said at least two counter electrode direct-coupled Josephson junctions.

16. A superconductive logic device, operatively connectable to receive first and second input signals and a bias signal, comprising:

a superconductive ground plane;

a first insulating layer formed on said superconductive ground plane;

a T-shaped superconductive base electrode having a leg portion for receiving the bias signal and having first and second arm portions;

second and third insulating layers formed on different regions of said T-shaped superconductive base electrode, said second insulating layer being thicker than said third insulating layer, said third insulating layer forming first and second discrete regions on said first and second arm portions of said T-shaped superconductive base electrode, respectively;

a superconductive counter electrode, having first and second extensions formed on said second and third insulating layers, said first extension for receiving the first input signal and extending over the first arm portion of said T-shaped superconductive base electrode, said second extension receiving the second input signal and extending over the second arm portion of said T-shaped superconductive base electrode, said superconductive counter electrode further having a third extension connected to said superconductive ground plane;

said superconductive logic device being formed by at least two counter electrode direct-coupled Josephson junctions operatively connected in parallel, said first counter electrode direct-coupled Josephson junction comprising said first arm portion of said superconductive base electrode, said superconductive counter electrode and said first discrete region of said third insulating layer formed therebetween, the first input signal being supplied to said superconductive ground plane through said superconductive counter electrode, so as to apply a magnetic field to said first counter electrode direct-coupled Josephson junction, said second counter electrode direct-coupled Josephson junction comprising said second arm portion of said T-shaped superconductive base electrode, said superconductive counter electrode and said second discrete region of said third insulating layer formed therebetween, the second input signal being supplied to said superconductive ground plane through said superconductive counter electrode, so as to apply a magnetic field to said second counter electrode direct-coupled Josephson junction.

* * * * *

UNITED STATES PATENT AND TRADEMARK OFFICE
CERTIFICATE OF CORRECTION

PATENT NO. : 4,423,430

DATED : DECEMBER 27, 1983

INVENTOR(S) : SHINYA HASUO ET AL.

It is certified that error appears in the above-identified patent and that said Letters Patent is hereby corrected as shown below:

```
Col. 1, line 4, delete "1. Field of";
        line 5, "the Invention" should be
                --1. Field of the Invention--.

Col. 2, line 15, after "the" insert --present--;
        line 63, "still" should be --also--.

Col. 3, line 64, "DRAWING" should be --DRAWINGS--.

Col. 9, line 22, "found" should be --formed--.

Col. 11, line 32, "becomes" should be --is placed--;
         line 61, "IN" should be --In--.

Col. 13, line 39, ",," should be --,--.

Col. 16, line 15, "form" should be --formed--.
```

Signed and Sealed this

Twenty-second Day of May 1984

[SEAL]

Attest:

GERALD J. MOSSINGHOFF

Attesting Officer

Commissioner of Patents and Trademarks